US008148679B2

(12) United States Patent
Makarov et al.

(10) Patent No.: US 8,148,679 B2
(45) **Date of Patent: *Apr. 3, 2012**

(54) EFFICIENT ATMOSPHERIC PRESSURE INTERFACE FOR MASS SPECTROMETERS AND METHOD

(75) Inventors: Alexander Makarov, Bremen (DE); Reinhold Pesch, Weyhe (DE); Robert Malek, Lilienthal (DE); Viacheslav Kozlovskiy, Chernogolovka (RU)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 170 days.

This patent is subject to a terminal disclaimer.

(21) Appl. No.: 12/513,944

(22) PCT Filed: Nov. 7, 2007

(86) PCT No.: PCT/EP2007/009642

§ 371 (c)(1), (2), (4) Date: May 7, 2009

(87) PCT Pub. No.: WO2008/061628

PCT Pub. Date: May 29, 2008

(65) Prior Publication Data

US 2010/0038532 A1 Feb. 18, 2010

Related U.S. Application Data

(60) Provisional application No. 60/857,737, filed on Nov. 7, 2006.

(51) Int. Cl.
*H01J 37/301* (2006.01)
*H01J 49/04* (2006.01)
*H01J 49/24* (2006.01)
*H01J 3/18* (2006.01)

(52) U.S. Cl. ........ 250/283; 250/288; 250/289; 250/293; 250/297; 250/396 R; 313/360.1; 313/7

(58) Field of Classification Search .................. 250/283, 250/289, 293, 288, 296 R, 297; 313/360.1, 313/7

See application file for complete search history.

(56) References Cited

U.S. PATENT DOCUMENTS 2,883,568 A * 4/1959 Beam et al. ........................ 313/7

(Continued)

FOREIGN PATENT DOCUMENTS

JP 11307040 A 11/1999

(Continued)

OTHER PUBLICATIONS

Shenheng et al., "Stacked-Ring Electrostatic Ion Guide," Journal of the American Society for Mass Spectrometry, Elsevier Science Inc. (US), vol. 7 ( No. 1), pp. 101-106, (1996).

*Primary Examiner* — Nikita Wells

(74) *Attorney, Agent, or Firm* — Charles B. Katz; Pamela Lau Kee

(57) ABSTRACT

An ion transfer arrangement for transporting ions between higher and lower pressure regions of the mass spectrometer comprises an ion transfer conduit 60. The conduit 60 has an inlet opening towards a relatively high pressure chamber 40 and an outlet 70 opening towards a relatively low pressure chamber. The conduit 60 also has at least one side wall surrounding an ion transfer channel 115. The side wall includes a plurality of apertures 140 formed in the longitudinal direction of the side wall so as to permit a flow of gas from within the ion transfer channel 115 to a lower pressure region outside of the side wall of the conduit 60.

11 Claims, 11 Drawing Sheets

U.S. PATENT DOCUMENTS

| | | | | |
|---|---|---|---|---|
| 3,308,323 | A * | 3/1967 | Van de Graaff | 313/360.1 |
| 6,486,469 | B1 | 11/2002 | Fischer et al. | |
| 6,504,150 | B1 | 1/2003 | Verentchikov et al. | |
| 6,781,117 | B1 | 8/2004 | Willoughby et al. | |
| 6,906,322 | B2 | 6/2005 | Berggren et al. | |
| 2003/0136905 | A1 | 7/2003 | Franzen et al. | |
| 2004/0108450 | A1* | 6/2004 | Makarov et al. | 250/281 |
| 2009/0321655 | A1* | 12/2009 | Makarov et al. | 250/396 R |
| 2010/0038533 | A1* | 2/2010 | Makarov et al. | 250/288 |

FOREIGN PATENT DOCUMENTS

| | | | |
|---|---|---|---|
| JP | 2000-113852 | A | 4/2000 |
| JP | 2001-343364 | A | 12/2001 |
| JP | 2001-349871 | A | 12/2001 |
| JP | 2003-502803 | A | 1/2003 |
| JP | 2003-507874 | A | 2/2003 |
| JP | 2004-111149 | A | 4/2004 |
| JP | 2005-85538 | A | 3/2005 |
| JP | 2005-259477 | A | 9/2005 |

* cited by examiner

EFFICIENT ATMOSPHERIC PRESSURE INTERFACE FOR MASS SPECTROMETERS AND METHOD

CROSS-REFERENCE TO RELATED APPLICATIONS

This application is a National Stage application under 35 U.S.C. §371 of PCT Application No. PCT/EP2007/009642, filed Nov. 7, 2007, entitled "Ion Transfer Arrangement", which claims the priority benefit of U.S. Provisional Application No. 60/857,737, filed Nov. 7, 2006, entitled "Ion Transfer Tube with Spatially Alternating DC Fields", and U.S. application Ser. No. 11/833,209, filed Aug. 2, 2007, entitled "Efficient Atmospheric Pressure Interface for Mass Spectrometers and Method", which applications are incorporated herein by reference in their entireties.

FIELD OF THE INVENTION

This invention relates to an ion transfer arrangement, for transporting ions within a mass spectrometer, and more particularly to an ion transfer arrangement for transporting ions from an atmospheric pressure ionisation source to the high vacuum of a mass spectrometer vacuum chamber.

BACKGROUND OF THE INVENTION

Ion transfer tubes, also known as capillaries, are well known in the mass spectrometry art for the transport of ions between an ionization chamber maintained at or near atmospheric pressure and a second chamber maintained at reduced pressure. Generally described, an ion transfer channel typically takes the form of an elongated narrow tube (capillary) having an inlet end open to the ionization chamber and an outlet end open to the second chamber. Ions, together with charged and uncharged particles (e.g., partially desolvated droplets from an electrospray or APCI probe, or Ions and neutrals and Substrate/Matrix from a Laser Desorption or MALDI source) and background gas, enter the inlet end of the ion transfer capillary and traverse its length under the influence of the pressure gradient. The ion/gas flow then exits the ion transfer tube as a free jet expansion. The ions may subsequently pass through the aperture of a skimmer cone through regions of successively lower pressures and are thereafter delivered to a mass analyzer for acquisition of a mass spectrum.

There is a significant loss in existing ion transfer arrangements, so that the majority of those ions generated by the ion source do not succeed in reaching and passing through the ion transfer arrangement into the subsequent stages of mass spectrometry.

A number of approaches have been taken to address this problem. For example, the ion transfer tube may be heated to evaporate residual solvent (thereby improving ion production) and to dissociate solvent-analyte adducts. A counterflow of heated gas has been proposed to increase desolvation prior to entry of the spray into the transfer channel. Various techniques for alignment and positioning of the sample spray, the capillary tube and the skimmer have been implemented to seek to maximize the number of ions from the source that are actually received into the ion optics of the mass spectrometers downstream of the ion transfer channel.

It has been observed (see, e.g., Sunner et. al, J. Amer. Soc. Mass Spectrometry, V. 5, No. 10, pp. 873-885 (October 1994)) that a substantial portion of the ions entering the ion transfer tube are lost via collisions with the tube wall. This diminishes the number of ions delivered to the mass analyzer and adversely affects instrument sensitivity. Furthermore, for tubes constructed of a dielectric material, collision of ions with the tube wall may result in charge accumulation and inhibit ion entry to and flow through the tube. The prior art contains a number of ion transfer tube designs that purportedly reduce ion loss by decreasing interactions of the ions with the tube wall, or by reducing the charging effect. For example, U.S. Pat. No. 5,736,740 to Franzen proposes decelerating ions relative to the gas stream by application of an axial DC field. According to this reference, the parabolic velocity profile of the gas stream (relative to the ions) produces a gas dynamic force that focuses ions to the tube centerline.

Other prior art references (e.g., U.S. Pat. No. 6,486,469 to Fischer) are directed to techniques for minimizing charging of a dielectric tube, for example by coating the entrance region with a layer of conductive material connected to a charge sink.

Another approach is to "funnel" ions entering from atmosphere towards a central axis. The concept of an ion funnel for operation under vacuum conditions after an ion transfer capillary was first set out in U.S. Pat. No. 6,107,628 and then described in detail by Belov et al in J Am Soc Mass Spectrom 200, Vol 11, pages 19-23. More recent ion funneling techniques are described in U.S. Pat. No. 6,107,628, in Tang et al, "Independent Control of Ion transmission in a jet disrupter Dual-Channel ion funnel electrospray ionization MS interface", Anal. Chem. 2002, Vol 74, p 5431-5437, which shows a dual funnel arrangement, in Page et al, "An electrodynamic ion funnel interface for greater sensitivity and higher throughput with linear ion trap mass spectrometers", Int. J. Mass Spectrometry 265 (2007) p 244-250, which describes an ion funnel adapted for use in a linear trap quadrupole (LTQ) arrangement. Unfortunately, effective operation of ion funnel extends only up to gas pressures of approximately 40 mbar, i.e 4% of atmospheric pressure.

A funnel shaped device with an opening to atmospheric pressure is disclosed in Kremer et al, "A novel method for the collimation of ions at atmospheric pressure" in J. Phys D:Appl Phys. Vol 39 (2006) p 5008-5015, which employs a floating element passive ion lens to focus ions (collimate them) electrostatically. However, it does not address the issue of focusing ions in the pressure region between atmospheric and forevacuum.

Still another alternative arrangement is set out in U.S. Pat. No. 6,943,347 to Willoughby et al., which provides a stratified tube structure having axially alternating layers of conducting electrodes. Accelerating potentials are applied to the conducting electrodes to minimize field penetration into the entrance region and delay field dispersion until viscous forces are more capable of overcoming the dispersive effects arising from decreasing electric fields. Though this is likely to help reducing ion losses, actual focusing of ions towards the central axis would require ever increasing axial field which is becomes technically impossible at low pressures because of breakdown.

Yet other prior art references (e.g., U.S. Pat. No. 6,486,469 to Fischer) are directed to techniques for minimizing charging of a dielectric tube, for example by coating the entrance region with a layer of conductive material connected to a charge sink.

While some of the foregoing approaches may be partially successful for reducing ion loss and/or alleviating adverse effects arising from ion collisions with the tube wall, the focusing force is far from sufficient for keeping ions away from the walls, especially given significant space charge within the ion beam and significant length of the tube. The latter requirement appears from the need to desolvate clusters formed by electrospray or APCI ion source. In an alternative arrangement, the tube could be replaced by a simple aperture and then desolvation region must be provided in front of this aperture. However, gas velocity is significantly lower in this region than inside the tube and therefore space charge effects produce higher losses. Therefore, there remains a need in the art for ion transfer tube designs that achieve further reductions in ion loss and are operable over a greater range of experimental conditions and sample types.

SUMMARY OF THE INVENTION

Against this background, and in accordance with a first aspect of the present invention, there is provided a An ion transfer arrangement for transporting ions between a relatively high pressure region and a relatively low pressure region, comprising:

- an ion transfer conduit having an inlet opening towards a relatively high pressure chamber, an outlet opening towards a relatively low pressure chamber, and at least one sidewall surrounding an ion transfer channel, the sidewall extending along a central axis between the inlet end and the outlet end; and a plurality of apertures formed in the longitudinal direction of the sidewall so as to permit a flow of gas from within the ion transfer channel to a lower pressure region outside of the sidewall of the conduit.

According to a second aspect of the present invention, there is provided method of transporting ions between a first, relatively high pressure region and a second, relatively low pressure region, comprising the steps of:

- admitting, from the relatively high pressure region, a mixture of ions and gas into an inlet opening of an ion transfer conduit having or defining an ion transfer channel;
- removing a portion of the gas in the ion transfer channel, through a plurality of passageways in a conduit wall located intermediate the inlet opening and an outlet opening of the ion transfer conduit; and
- causing the ions and the remaining gas to exit the ion transfer conduit through the exit opening towards the relatively low pressure region.

In a simple form, an interface for a mass spectrometer in accordance with embodiments of the present invention includes an ion transfer tube having an inlet end opening to a high pressure chamber and an outlet end opening to a low pressure chamber. The high and low pressure chambers may be provided by any regions that have respective higher and lower pressures relative to each other. For example, the high pressure chamber may be an ion source chamber and the low pressure chamber may be a first vacuum chamber. The ion transfer tube has at least one sidewall surrounding an interior region and extending along a central axis between the inlet end and the outlet end. The ion transfer tube has a plurality of passageways formed in the sidewall. The passageways permit the flow of gas from the interior region to a reduced-pressure region exterior to the sidewall.

In another simple form, embodiments of the present invention include an ion transfer tube for receiving and transporting ions from a source in a high pressure region to ion optics in a reduced pressure region of a mass spectrometer. The ion transfer tube includes an inlet end, an outlet end, and at least one sidewall surrounding an interior region and extending along a central axis between the inlet end and the outlet end. The ion transfer tube may also include an integral vacuum chamber tube at least partially surrounding and connected to the ion transfer tube. The integral vacuum chamber tube isolates a volume immediately surrounding at least a portion of the ion transfer tube at a reduced pressure relative to the interior region. The sidewall has a structure that provides at least one passageway formed in the sidewall. The at least one passageway permits a flow of gas from the interior region to the volume exterior to the sidewall. The structure and passageway are inside the integral vacuum chamber tube. The structure of the sidewall may include a plurality of passageways.

In still another simple form, embodiments of the present invention include a method of transporting ions from an ion source region to a first vacuum chamber. The method includes admitting from the ion source region, a mixture of ions and gas to an inlet end of an ion transfer tube. The method also includes removing a portion of the gas through a plurality of passageways located intermediate the inlet end and an outlet end of the ion transfer tube. The method further includes causing the ions and the remaining gas to exit the ion transfer tube through the outlet end into the first vacuum chamber. The method may also include sensing a reduction in latent heat in the ion transfer tube due to at least one of removal of the portion of the background gas and an associated evaporation, and increasing an amount of heat applied to the ion transfer tube through a heater under software or firmware control.

The embodiments of the present invention have the advantage of reduced flow of gas through an exit end of the ion transfer tube. Several associated advantages have also been postulated. For example, the reduced flow through the exit end of the ion transfer tube decreases the energy with which the ion bearing gas expands as it leaves the ion transfer tube. Thus, the ions have a greater chance of traveling on a straight line through an aperture of a skimmer immediately downstream. Also, reduction of the flow in at least a portion of the ion transfer tube may have the effect of increasing the amount of laminar flow in that portion of the ion transfer tube. Laminar flow is more stable so that the ions can remain focused and travel in a straight line for passage through the relatively small aperture of a skimmer. With gas being pumped out through a sidewall of the ion transfer tube, the pressure inside the ion transfer tube is reduced. Reduced pressure can cause increased desolvation. Furthermore, latent heat is removed when the gas is pumped out through the sidewall. Hence, more heat may be transferred through the ion transfer tube and into the sample remaining in the interior region resulting in increased desolvation and increased numbers of ions actually reaching the ion optics.

Further features and advantages of the present invention will be apparent from the appended claims and the following description.

DETAILED DESCRIPTION OF A PREFERRED EMBODIMENT

Figure 1:
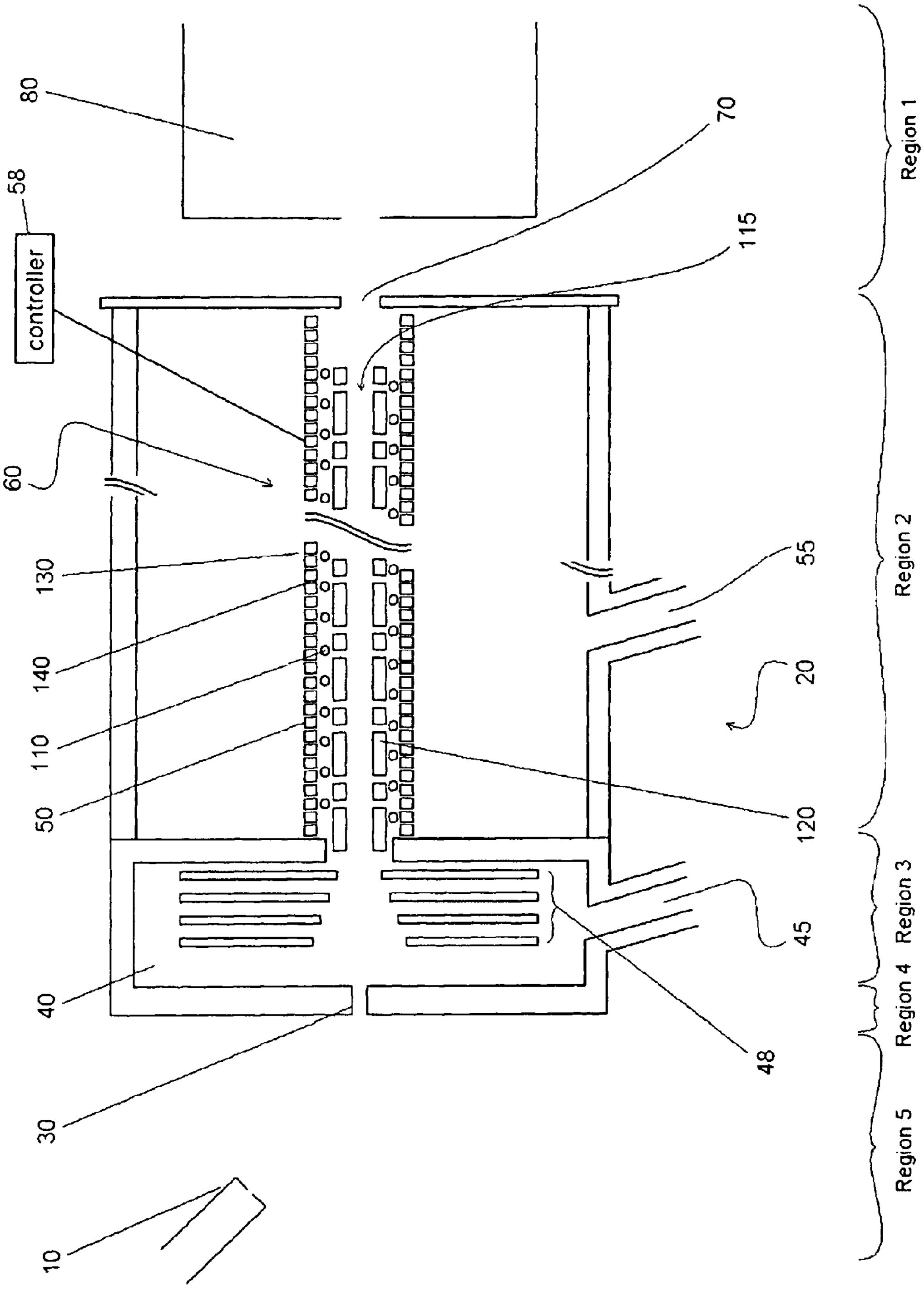
FIG. 1 shows a cross-sectional diagram of an ion transfer arrangement in accordance with a first embodiment of the present invention . . .

FIG. 1 shows an ion transfer arrangement embodying various aspects of the present invention, for carrying ions between an atmospheric pressure ion source (e.g. electrospray) and the high vacuum of a subsequent vacuum chamber in which one or more stages of mass spectrometry are situated. In FIG. 1, an ion source 10 such as (but not limited to) an electrospray source, atmospheric pressure chemical ionization (APCI) or atmospheric pressure photoionization (APPI) source is situated at atmospheric pressure. This produces ions in well known manner, and the ions enter an ion transfer arrangement (indicated generally at reference numeral 20) via entrance aperture 30. Ions then pass through a first pumped transport chamber 40 (hereinafter referred to as an expansion chamber 40) and on into a second vacuum chamber 50 containing an ion conduit 60. Ions exit the conduit 60 and pass through an exit aperture 70 of the ion transfer arrangement where they enter (via a series of ion lenses—not shown) a first stage of mass spectrometry (hereinafter referred to as MS1) 80. As will be readily understood by the skilled person, MS1 will usually be followed by subsequent stages of mass spectrometry (MS2, MS3 . . . ) though these do not form a part of the present invention and are not shown in FIG. 1 for clarity therefore.

A more detailed explanation of the configuration of components in the ion transfer arrangement 20 of FIG. 1 will be provided below. In order better to understand that configuration, however a general discussion of the manner of ion transport in different pressure regions between atmosphere and forevacuum (say, below about 1-10 mbar) will first be provided.

Ion transport is characteristically different in the different pressure regions in and surrounding the ion transport arrangement 20 of FIG. 1. Although in practice the pressure does not of course change instantaneously at any point between the ion source and MS1 80, nonetheless five distinct pressure regions can be defined, with different ion transport characteristics in each. The five regions are marked in FIG. 1 and are as follows:

Region 1. This is the region where entrance ion optics of MS1 is situated, with pressures below approx. 1-10 mbar. This region is not addressed by the present invention.

Region 5. This is the atmospheric pressure region and is mostly dominated by dynamic flow and the electrospray or other atmospheric pressure ionization source itself. As with Region 1, it is not directly addressed by the present invention. This leaves Regions 2, 3 and 4.

Region 4: This is in the vicinity of the entrance orifice 30 to the ion transport arrangement 20.

Region 2: This is the region in which the conduit 60 is situated, which abuts the exit aperture 70 of the ion transport arrangement 20 into MS1. Finally, Region 3: This is the region between the entrance orifice 30 (Region 4) of the ion transport arrangement 20, and Region 2 as described above.

Measurements of the ion current entering the ion transport arrangement (at the entrance orifice 30) of a typical commercially available capillary indicate that it is in the range of $I_0 \approx 2.5$ nA. Hence, knowing the incoming gas flow value Q=8 $atm\cdot cm^3/S$, and the inner diameter of the conduit of 0.5 mm, the range of the initial charge density $\rho_0$ may be estimated as $0.3\text{-}1*10^{-9}$ C/cm$^3$=(0.3 . . . 1)*$10^{-3}$ C/m$^3$. Knowing the dwell time of the ions inside the conduit, t=0.113 m/50 m/s≈2*$10^{-3}$ s, and the average ion mobility value at atmospheric pressure K=$10^{-4}$ m$^2$/s, the limit of the transmission efficiency because of the space charge repulsion can be determined from:

$$\left[\frac{\rho}{\rho_0}\right]_{sc} = \frac{1}{1+\frac{\rho_0 K t}{\varepsilon_0}} = \frac{1}{1+\frac{\rho_0\cdot 10^{-4}\cdot 2\cdot 10^{-3}}{8.85\cdot 10^{-12}}} \approx 0.13$$

Thus to improve ion current (which is an aim of aspects of the present invention), the ion mobility and ion dwell time in the conduit are preferably optimized.

An essential part of the ion loss in an atmospheric pressure ionization (API) source takes place in the ionisation chamber in front of the entrance orifice 30 of the interface. This proportion of the ion loss is determined by the ion/droplet drift time from the Taylor cone of the API source to the entrance orifice 30. The gas flow velocity distribution in vicinity of the entrance orifice 30 is $$V_{gas} = \frac{Q_{gas}}{2\pi R^2} = C\langle P\rangle \Delta P \frac{d^4}{R^2},$$

where d is the diameter of the conduit, and R is the distance from the point to the entrance orifice 30, C is a constant and ΔP is pressure drop. The ion velocity is $V_{ion}=V_{gas}+KE$, where K is the ion mobility, and E is the electrical field strength. Assuming that K~10$^{-4}$ m$^2$/s, and E~5·10$^5$ V/m, the velocity caused by the electrical field is ~50 m/s. The gas flow velocity inside the 0.5 mm ID conduit is about the same value, but at a distance 5 mm from the entrance orifice 30, ions travelling with the gas are about 10 times slower than their drift in the electrical field. Hence, the ion dwell time in this region is in the range of $10^{-4}$ s, which results in an ion loss of about 50% because of space charge repulsion according to equation (2) above.

In other words, analytical consideration of the ion transfer arrangement suggests that space charge repulsion is the main ion loss mechanism. The main parameters determining the ion transmission efficiency are ion dwell time t in the conduit, and ion mobility K. Thus one way to improve ion transport efficiency would be to decrease t. However, there is a series of limitations on the indefinite increase of t:

1. The time needed to evaporate droplets;
2. The critical velocity at which laminar gas flow transforms into turbulent gas flow; and
3. The appearance of shock waves when the gas flow accelerates to the speed of sound. This is especially the case when a big pressure drop is experienced from regions 5 to (1000 to 1 mbar approximately).

Returning now to FIG. 1, the preferred embodiment of an ion transport arrangement will now be described in further detail. The features and configuration employed seek to address the limitations on ion transport efficiency identified above.

The first regions to consider are regions 4 and 3 which define, respectively, the vicinity of the entrance aperture 30 and the expansion chamber 40.

In order to address ion losses in front of the entrance orifice 30, it is desirable to increase the incoming gas flow into the entrance orifice 30. This is in accordance with the analysis above—for a given ion current, a higher gas flow rate at the entrance to the ion transport arrangement allows to capture larger volume of gas and, given that gas is filled with ions up to saturation, more ions. Decreasing the dwell time in regions 3 and 4 conditions the ion stream to a high but not supersonic velocity.

Thus improvements are possible in Regions 4 and 3, by optimising or including components between the API source 10 and the entrance to the conduit 60. Regions 4 and 3, which interface between Region 5 at atmosphere and Region 2, desirably provide a gas dynamic focusing of ions which are typically more than 4-10 times heavier than nitrogen molecules for most analytes of interest.

A first aim is to avoid a supersonic flow mode between regions 5 and 2, as this can cause an unexpected ion loss. This aim can be achieved by the use of an entrance funnel 48, located in the expansion chamber 40. Such a funnel 48 is illustrated in FIG. 1 as a series of parallel plates with differing central apertures; the purpose of such an arrangement (and some alternatives) is set out below in connection with FIGS. 2-4. Desirably, the funnel 48 is short (practically, for segmented arrangements such as is shown in FIG. 1, 3 mm is about as short as is possible)—and desirably less than 1 cm long.

The expansion chamber 40 is preferably pumped to around 300-600 mbar by a diaphragm, extraction or scroll pump (not shown) connected to a pumping port 45 of the expansion chamber. By appropriate shaping of the ion funnel 48, expansion of ions as they enter the expansion chamber 40 can be arranged so as to control or avoid altogether shock wave formation.

As shown in the above referenced paper by Sunner et. al, even at low spray currents, atmospheric pressure sources (e.g. electrospray or APCI) are space-charge limited. It has been determined experimentally by the present inventors that, even with application of the highest electric fields, API sources are not capable of carrying more than 0.1-0.5*10-9 Coulomb/(atm·cm3). To capture most of this current even for a nanospray source this requires that the entrance aperture 30 has a diameter of at least 0.6-0.7 mm and is followed by strong accelerating and focusing electric field (though it is necessary to keep the total voltage drop below the onset for electric breakdown).

Figure 2:
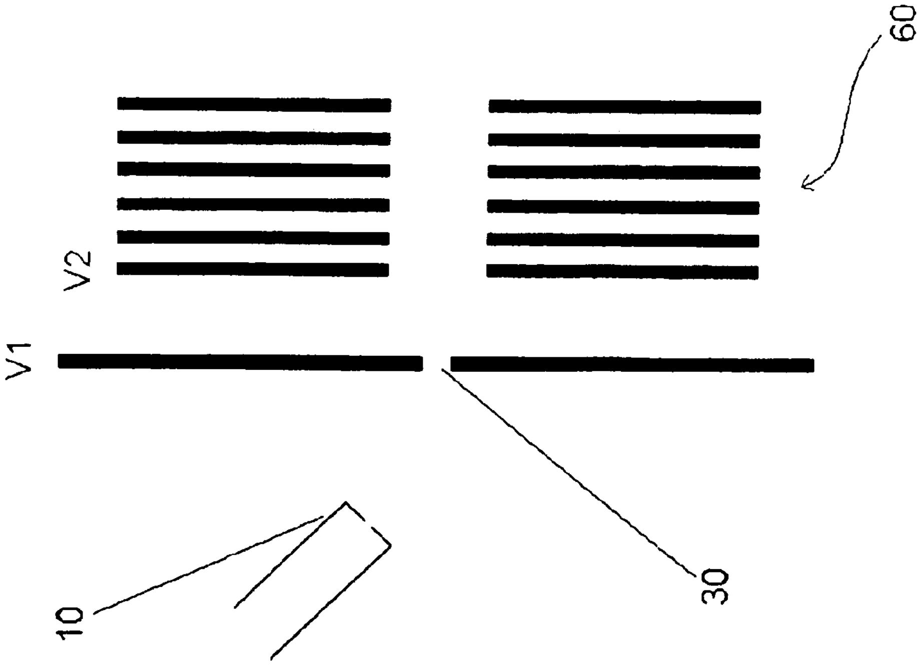
FIG. 2 shows an example of an ion entry region for the ion transfer arrangement of FIG. 1.

FIG. 2 is a schematic illustration of a simple arrangement to achieve this strong accelerating and focussing electric field. Here, the inlet aperture 30 is held at a first DC voltage V1 whilst a plate electrode 90 is held at a voltage V2, within the expansion chamber 40 but adjacent to the entrance to the conduit 60. The inlet aperture 30 and the plate electrode 90, with voltage applied, together constitute a simple ion funnel 48. The plate electrode in FIG. 2 has a central aperture which is generally of similar dimension to and aligned with the inner diameter of the conduit 60 but nevertheless acts to funnel ions into the conduit 60. The electrical field between aperture 30 and plate 90 effectively accelerates charged particles, and the fringe field at the opening drags the charged particles into the conduit as these tend to travel parallel to the field lines, even in viscous flow. This electrically assisted acceleration into the conduit region is generally preferred.

Figure 3:
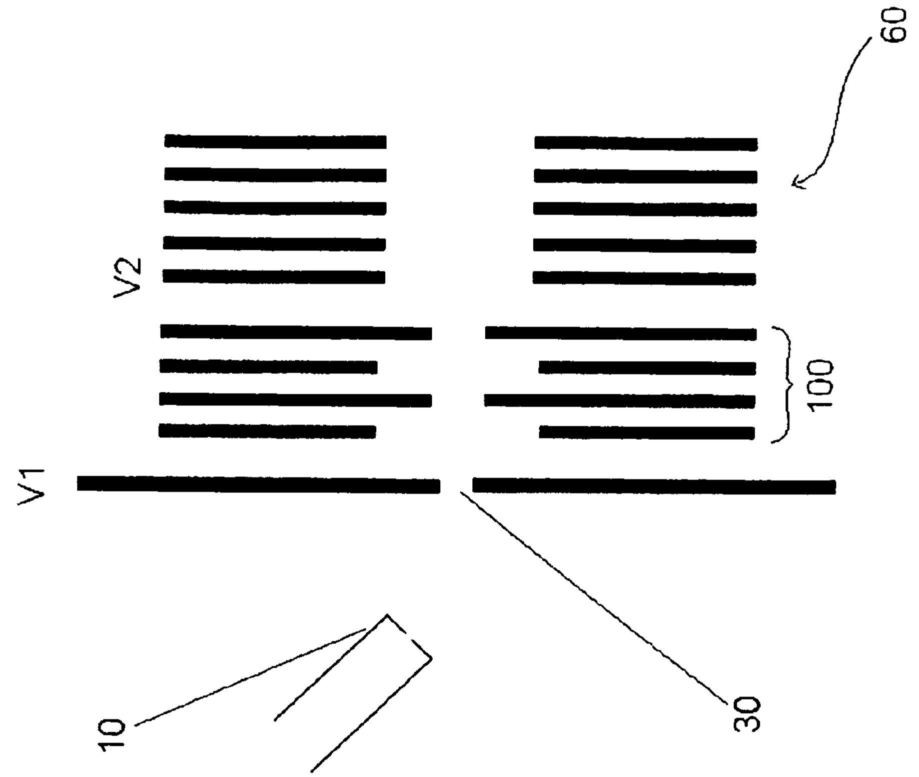
FIG. 3 shows the ion entry region of FIG. 2 with an aerodynamic lens to optimize flow.
Figure 4A:
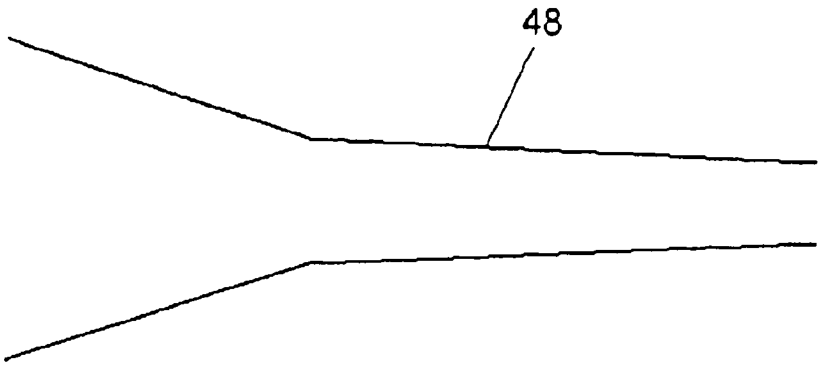
FIGS. 4*a*, 4*b* and 4*c* together show examples of envelopes of shaped embodiments for the ion entry region of FIGS. 2 and 3.

As a development to the simple arrangement of FIG. 2, the space in the expansion chamber 40 between the entrance orifice 30 at voltage V1 and the plate electrode at voltage V2 can comprise further ion lenses or aerodynamic lenses, or combinations of the two. FIG. 3 shows this schematically: an array of plate electrodes 100 is mounted between the entrance orifice 30 and the plate electrode 90 to constitute an ion funnel 48. Each of the electrodes making up the array 100 of plate electrodes has a central aperture generally coaxial with those of the entrance orifice 30 and the plate electrode 90 but each is of differing diameter.

Various different shapes can be described by the array of plate electrodes 100: in the simplest case the funnel towards the conduit is just flared (linear taper). This is shown schematically in FIG. 4*a* and is described in further detail in Wu et al, "Incorporation of a Flared Inlet Capillary tube on a Fourier Transform Ion Cyclotron Resonance Mass Spectrometer, J. Am. Soc. Mass Spectrom. 2006 Vol 17, p 772-779. Alternative shapes are shown, likewise highly schematically, in FIGS. 4*b* and 4*c*, and are respectively a jet nozzle (Venturi device—see Zhou et al (Zhou, L.; Yue, B.; Dearden, D.; Lee, E.; Rockwood, A. & Lee, M. Incorporation of a Venturi Device in Electrospray Ionization *Analytical Chemistry,* 2003, 75, 5978-5983) and a trumpet or exponential shaped inlet.

Thus the effect of the arrangements of FIGS. 2 to 4 (and the arrangement shown in the expansion chamber 40 of FIG. 1) is to create a segmented funnel entrance to the conduit 60. In each case, the entrance aperture 30 could be smaller than the diameter of the focusing channel but large enough to allow significant gas flow. The objective of shaping the ion funnel is to convert the volume between the funnel exit and the entrance of the conduit 60 into an analog of a jet separator—a device still widely used in mass spectrometers coupled to gas chromatography. As molecules of analyte are significantly heavier than molecules of carrier gas (typically nitrogen), their divergence following expansion is much smaller than for the carrier gas, i.e. aerodynamic focusing takes place. This effect could be further facilitated by forming the carrier gas at least partially from helium, especially in case of the required voltages being low enough to cope with the lower glow discharge limit of noble gases. As a result, ions are held near the axis and can be transferred into the central portion of the focusing channel even for a channel diameter not much bigger than that of the funnel, e.g. 0.8-1.2 mm ID. Even though this diameter is larger than for traditional capillaries, the starting pressure is 2-3 times smaller so that it would still be possible to employ a vacuum pump at the end of the funnel of similar pumping capacity to those currently used, e.g. 28-40 m3/h. At the same time, active focusing of ions inside the funnel 48 allows the subsequent length of the conduit 60 to be increased without losses. This in turn improves the desolvation of any remaining droplets and clusters. In consequence, sample flow rates may be extended into higher ranges, far above the nanospray flow rate.

A very simple example of jet separation, which is just one example for an aerodynamic lens is discussed below in connection with some of the embodiments in FIGS. 9*a-d.*

As still further additions or alternatives to the arrangement of regions 4 and 3 of the preferred embodiment, the ion funnel 48 may include auxiliary pumping of a boundary layer at one or more points inside the channel, the pressure drop along the channel may be limited, and so forth. To sustain a strong electric field along such a funnel 48, these pumping slots could be used as gaps between thin plates at different potentials.

Referring again to FIG. 1, the configuration of Region 2 (i.e. the region between the expansion chamber 40 and the exit orifice 70 to MS1 80) will now be described in further detail.

The conduit 60 located in the vacuum chamber 50 and defining region 2 of the ion transfer arrangement is formed from three separate components: a heater 110, a set of DC electrodes 120 and a differential pumping arrangement shown generally at 130 and described in further detail below. It is to be understood that these components each have their own separate function and advantage but that they additionally have a mutually synergistic benefit when employed together. In other words, whilst the use of any one or two of these three components results in an improvement to the net ion flow into MS1, the combination of all three together tends to provide the greatest improvement therein.

The heater 110 is formed in known manner as a resistive winding around a channel defined by the set of DC electrodes which extend along the longitudinal axis of the conduit 60. The windings may be in direct thermal contact with the channel 115, or may instead be separate therefrom so that when current flows through the heater 110 windings, it results in radiative or convective heating of the gas stream in the channel. Indeed in another alternative arrangement, the heater windings may be formed within or upon the differential pumping arrangement 130 so as to radiate heat inwards towards the gas flow in the channel 115. In still another alternative, the heater may even be constituted by the DC electrodes 120 (provided that the resistance can be matched)—regarding which see further below. Other alternative arrangements will be apparent to the skilled reader.

Heating the ion transfer channel 115 raises the temperature of the gas stream flowing through it, thereby promoting evaporation of residual solvent and dissociation of solvent ion clusters and increasing the number of analyte ions delivered to MS1 80.

Figure 4B:
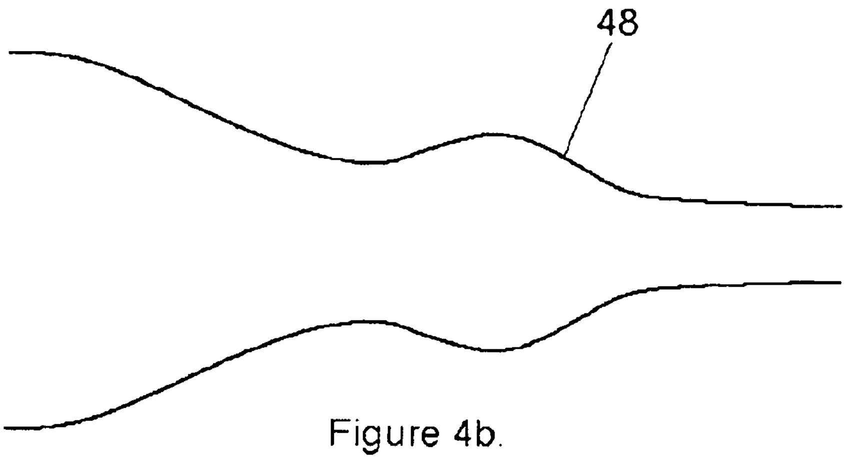
Figure 4C:
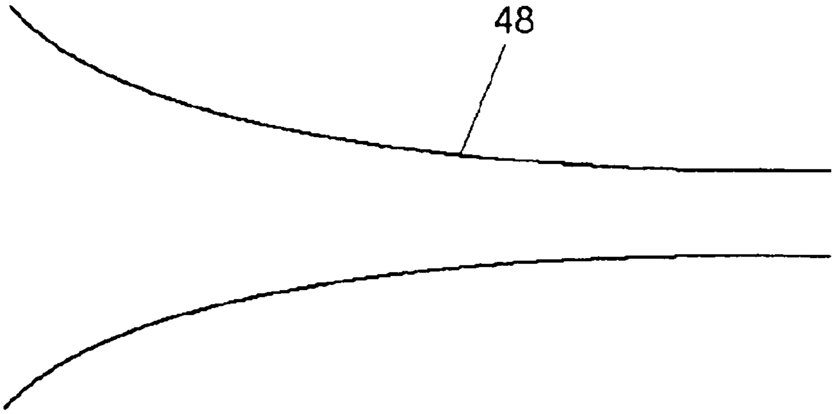
Figure 5A:
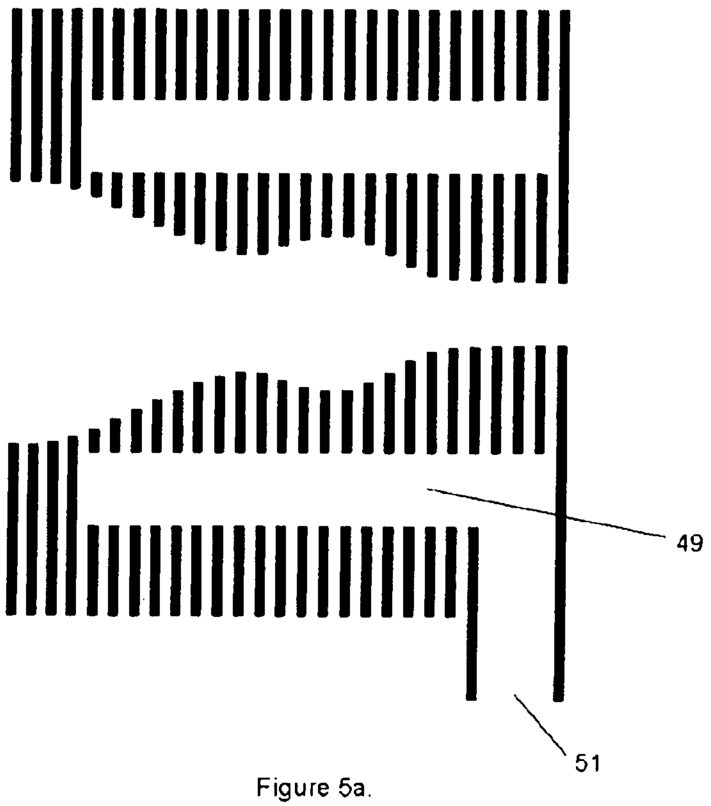
FIG. 5 shows, in further detail, the ion entry region having the shape shown in FIG. 4*b;*
Figure 5B:
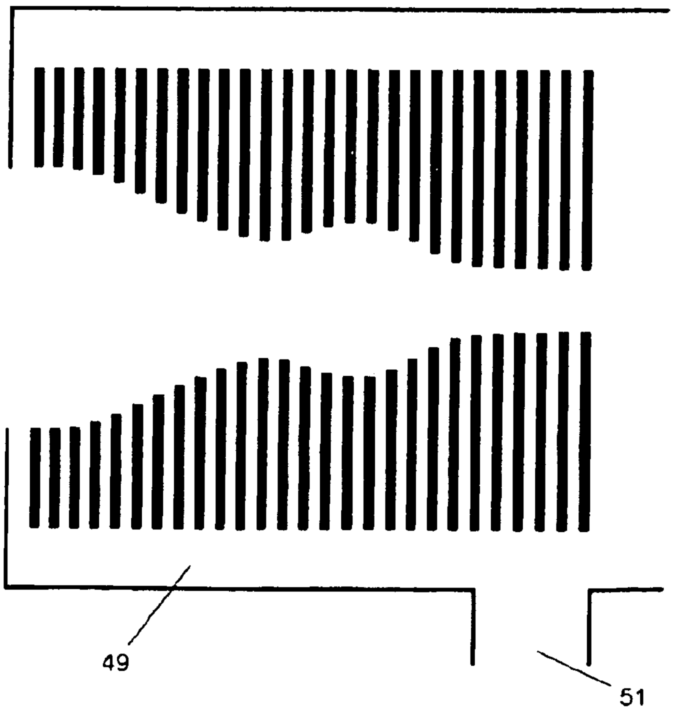

FIG. 5 shows an embodiment of the shape depicted in FIG. 4*b* as the entry region of a pumped conduit of stacked plate electrodes with provisions 48 for improved pumping. It is to be understood that the plate electrodes shown could be operated on DC, alternating DC, or RF, with the pumping and an adequate shape of the entrance opening improving transmission in all cases.

Embodiments of the set of DC electrodes 120 will now be described. These may be seen in schematic form and in longitudinal cross section in FIG. 1 once more, but alternative embodiments are shown in closer detail in FIGS. 6 and 7. In each case, like reference numerals denote like parts.

Figure 6:
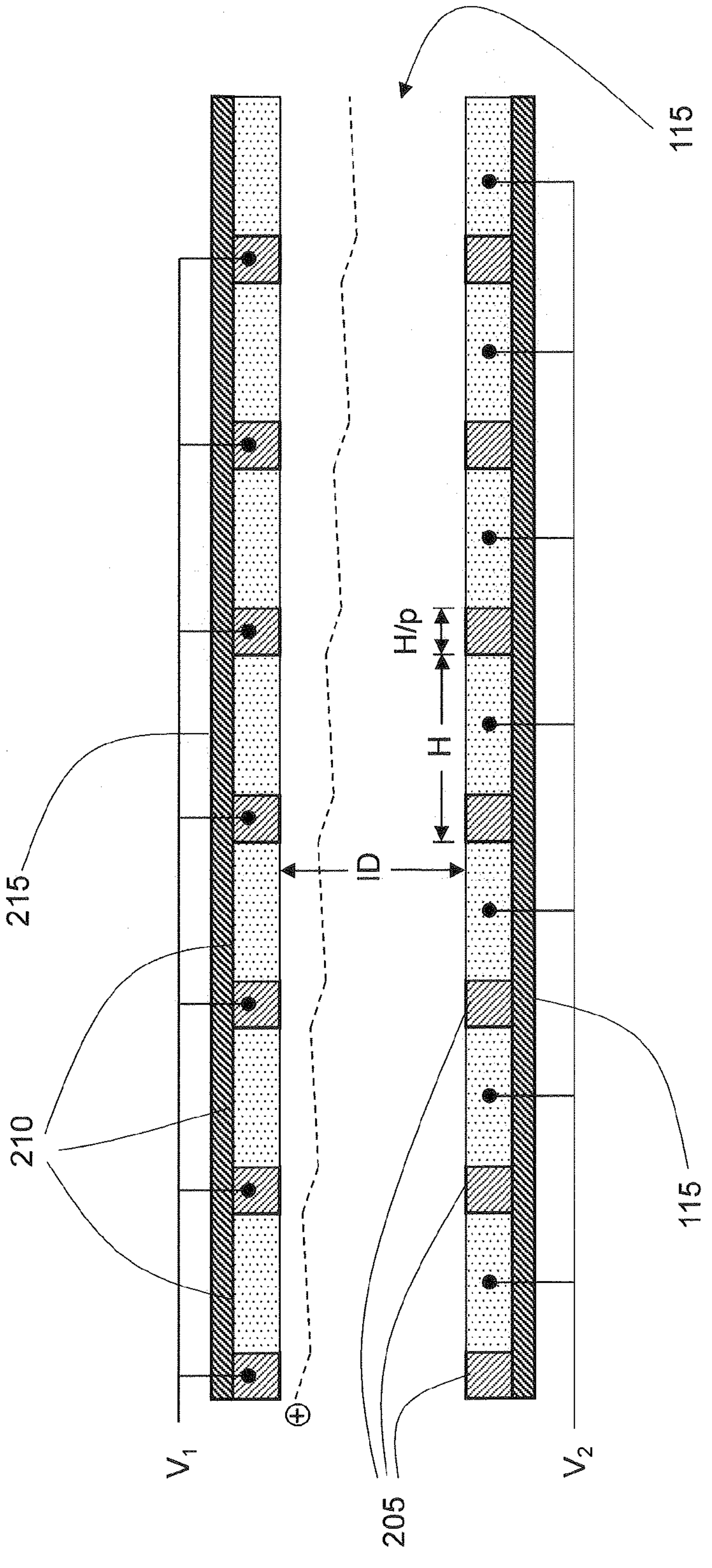
FIG. 6 shows a first embodiment of an alternating voltage conduit which forms a part of the ion transfer arrangement of FIG. 1.

Referring to FIGS. 1 and 6, the purpose of the DC electrodes 120 is to reduce the interaction of ions with the wall of the channel 115 defined by the DC electrodes 120 themselves. This is achieved by generating spatially alternating asymmetric electric fields that tend to focus ions away from the inner surface of the channel wall and toward the channel centerline. FIGS. 1 and 6 show in longitudinal cross-section examples of how ion transfer channel 115 may be constructed using a set of DC electrodes 120, to provide such electric fields. Ion transfer channel 115 is defined by a first plurality of electrodes 205 (referred to herein as "high field-strength electrodes" or HFE's for reasons that will become evident) arranged in alternating relation with a second plurality of electrodes 210 (referred to herein as "low field-strength electrodes", or LFE's). Individual HFE's 205 and LFE's 210 have a ring shape, and the inner surfaces of HFE's 205 and LFE's 210 collectively define the inner surface of the ion transfer channel wall. Adjacent electrodes are electrically isolated from each other by means of a gap or insulating layer so that different voltages may be applied, in the manner discussed below. In one specific implementation, electrical isolation may be accomplished by forming an insulating (e.g., aluminum oxide) layer at or near the outer surface of one of the plurality of electrodes (e.g., the LFE's.) As shown in FIG. 6, HFE's 205 and LFE's 210 may be surrounded by an outer tubular structure 215 to provide structural integrity, gas sealing, and to assist in assembly. In the preferred embodiment of FIG. 1, however, the outer tubular structure may be omitted or adapted with holes or pores to enable pumping of the interior region of ion transfer channel along its length (via gaps between adjacent electrodes)—a process which will be described further below.

It will be appreciated that, while FIGS. 1 and 6 depict a relatively small number of electrodes for clarity, a typical implementation of ion transfer channel 115 will include tens or hundreds of electrodes. It is further noted that although FIGS. 1 and 6 show the electrodes extending along substantially the full length of ion transfer channel 115, other implementations may have a portion or portions of the ion transfer channel length that are devoid of electrodes.

The electrodes are arranged with a period H (the spacing between successive LFE's or HFE's). The width (longitudinal extent) of HFE's 205 is substantially smaller than the width of the corresponding LFE's 210, with the HFE's typically constituting approximately 20-25% of the period H. The HFE width may be expressed as H/p, where p may be typically in the range of 3-4. The period H is selected such that ions traveling through ion transfer channel 115 experience alternating high and low field-strengths at a frequency that approximates that of a radio-frequency confinement field in conventional high-field asymmetric ion mobility spectrometry (FAIMS) devices. For example, assuming an average gas stream velocity of 500 meters/second, a period H of 500 micrometers yields a frequency of 1 megahertz. The period H may be maintained constant along the entire length of the tube, or may alternatively be adjusted (either in a continuous or step-wise fashion) along the channel length to reflect the variation in velocity due to the pressure gradient. The inner diameter (ID) of ion transfer channel 115 (defined by the inner surfaces of the LFE's 205 and HFE's 210) will preferably have a value greater than the period H.

One or more DC voltage sources (not depicted) are connected to the electrodes to apply a first voltage $V_1$ to HFE's 205 and a second voltage $V_2$ to LFE's 210. $V_2$ has a polarity opposite to and a magnitude significantly lower than $V_1$. Preferably, the ratio $V_1/V_2$ is equal to −p, where p (as indicated above) is the inverse of the fraction of the period H occupied by the LFE width and is typically in the range of 3-4, such that the space/time integral of the electric fields experienced by an ion over a full period is equal to zero. The magnitudes of $V_1$ and $V_2$ should be sufficiently great to achieve the desired focusing effect detailed below, but not so great as to cause discharge between adjacent electrodes or between electrodes and nearby surfaces. It is believed that a magnitude of 50 to 500 V will satisfy the foregoing criteria.

Application of the prescribed DC voltages to HFE's 205 and LFE's 210 generates a spatially alternating pattern of high and low field strength regions within the ion transfer channel 115 interior, each region being roughly longitudinally co-extensive with the corresponding electrode. Within each region, the field strength is at or close to zero at the flow centerline and increases with radial distance from the center, so that ions experience an attractive or repulsive radial force that increases in magnitude as the ion approaches the inner surface of the ion transfer tube. The alternating high/low field strength pattern produces ion behavior that is conceptually similar to that occurring in conventional high-field asymmetric ion mobility spectrometry (FAIMS) devices, in which an asymmetric waveform is applied to one electrode of an opposed electrode pair defining a analyzer region (see, e.g., U.S. Pat. No. 7,084,394 to Guevremont et al.)

FIG. 6 shows the trajectory of a positive ion positioned away from the flow centerline under the influence of the alternating asymmetric electric fields. The ion moves away from inner surface of the ion transfer channel in the high field-strength regions and toward the inner surface in the low field-strength regions (this assumes that the HFE's 205 have a positive voltage applied thereto and the LFE's 210 carry a negative (again, noting that the polarities should be assigned with reference to the smoothed (i.e. averaged over the spatial period) potential distribution along the flow path, as described above), producing a zigzag path.

As has been described in detail in the FAIMS art, the net movement of an ion in a viscous flow region subjected to alternating high/low fields will be a function of the variation of the ion's mobility with field strength. For A-type ions, for which the ion mobility increases with increasing field strength, the radial distance traveled in the high field-strength portion of the cycle will exceed the radial distance traveled during the low field-strength portion. For the example depicted in FIG. 6 and described above, an A-type ion will exhibit a net radial movement toward the flow centerline, thereby preventing collisions with the ion transfer channel 115 inner surface and consequent neutralization. As the ion approaches the flow centerline, the field strength diminishes substantially, and the ion ceases to experience a strong radial force arising from the electrodes. Conversely, for a C-type ion (for which ion mobility decreases with increasing field strength), the radial distance traveled by an ion in the low field-strength regions will exceed that traveled in the high field-strength regions, producing a net movement toward the ion transfer channel 115 inner surface if the polarities of $V_1$ and the ion are the same. This behavior may be used to discriminate between A- and C-type ions, since C-type ions will be preferentially destroyed by collisions with the channel wall while the A-type ions will be focused to the flow centerline. If preferential transport of C-type ions is desired, then the polarities of $V_1$ and $V_2$ may be switched.

The above-described technique of providing alternating DC fields may be inadequate to focus ions in regions where gas dynamic forces deflect the ions' trajectory from a purely longitudinal path or the mean free path becomes long enough (i.e., where collisions with gas atoms or molecules no longer dominate ion motion). For example, gas expansion and acceleration within ion transfer channel 115 due to the pressure differential between the API source 10 at atmospheric pressure and MS1 80 at high vacuum (<1 mbar) may cause one or more shock waves to be generated within the ion transfer channel interior near its outlet end, thereby sharply deflecting the ions' paths. For electrodes disposed at the distal portions of ion transfer channel 115, it may be necessary to apply an RF voltage (either with or in place of the DC voltage) to provide sufficient focusing to avoid ion-channel wall interactions. In this case, RF voltages of opposite phases will be applied to adjacent electrodes.

An alternative approach to suppress shock waves is to differentially pump the conduit 60 (FIG. 1) and this will be described below.

Figure 7:
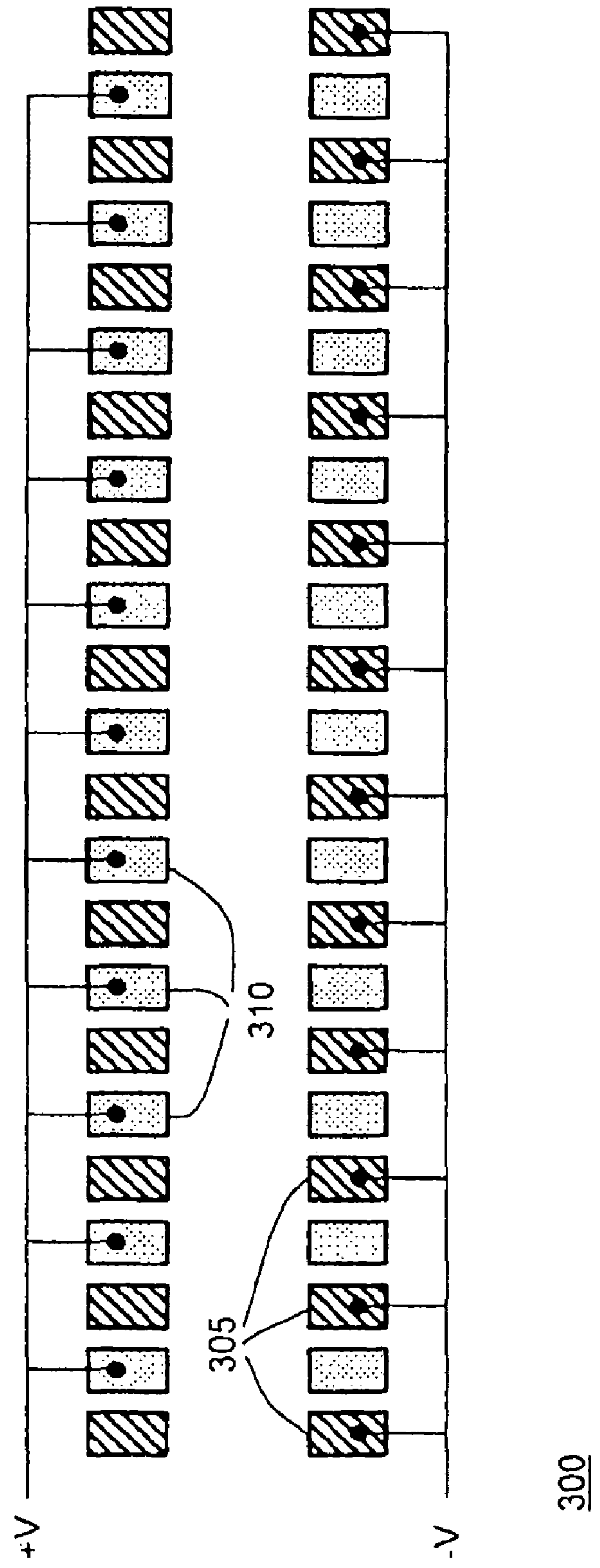
FIG. 7 shows a second embodiment of an alternating voltage conduit.

FIG. 7 depicts an ion focusing/guide structure 300 according to a second embodiment of the invention, which may be utilized to transport ions through near-atmospheric or lower pressure regions of a mass spectrometer instrument. At such pressures, ions are "embedded" into gas flow due to high viscous friction and therefore have velocity similar to that of gas flow.

Generally we consider a flow as viscous as opposed to molecular flow when the mean free path of the ions is small compared to the dimensions of the device. In that case collisions between molecules or between molecules and ions play an important role in transport phenomena.

For devices according to the invention with a typical diameter of a few millimeters or up to a centimeter and an overall length of a few centimeters or decimeters, and a pressure gradient from approximately atmospheric pressure to pressures of about one hpa, we have viscous flow conditions throughout the inventive device.

Actually the viscous flow condition of the Knudsen number K=lambda/D being less than 1 we have viscous flow down to pressures of approx. 1 to 10 pa, depending on the analytes and dimensions (1 pa for small molecules like metabolites in a 1 mm diameter capillary).

Focusing/guide structure 300 is composed of a first plurality of ring electrodes (hereinafter "first electrodes") 305 interposed in alternating arrangement with a second plurality of ring electrodes (hereinafter "second electrodes") 310. Adjacent electrodes are electrically isolated from each other by means of a gap or insulating material or layer. In contradistinction to the embodiment of FIG. 5, the first and second electrodes 305 and 310 are of substantially equal widths. The configuration of ring electrodes 305 and 310 is facially similar to that of an RF ring electrode ion guide, which is well-known in the mass spectrometry art. However, rather than applying opposite phases of an RF voltage to adjacent electrodes, focusing/guide structure 300 employs DC voltages of opposite sign and equal magnitude applied to adjacent electrodes. By appropriate selection of the electrode period D relative to the gas (ion) velocity, ions traversing the interior of the guiding/focusing structure experience fields of alternating polarity at a frequency (e.g., on the order of 1 megahertz) that approximates that a conventional RF field. The alternating fields contain and focus ions in much the same manner as does the RF field. Selection of an appropriate DC voltage to be applied to first and second electrodes 305 and 310 will depend on various geometric (electrode inner diameter and width) and operational (gas pressure) parameters; in a typical implementation, a DC voltage of 100 to 500 V will be sufficient to generate the desired field strength without causing discharge between electrodes. Also, an additional RF voltage could be applied with these DC voltages (thus effectively providing a focusing field at an independent frequency).

In this arrangement as well as in the other inventive arrangements, the run length H is preferentially small, with dimensions around 0.1 to 20 mm, typically about 1 mm, such that the mean free path of ions is usually shorter than the relevant dimensions of the conduit.

As opposed to the arrangement of FIG. 6 that can be tuned to preferentially transmit A or C type ions, the simpler arrangement of FIG. 7 will not show a significant bias regarding differential ion mobility characteristics of ions, but simply improve transmission of all charged particles.

A similar effect can be achieved by adjustment of the FIG. 6 arrangement to the conditions for transmission of B-type ions (that is with the voltages set such that no distinct high and low field regions are created.

In an alternative mode of operation the apparatus of FIG. 7 could be directly operated with an alternating high and low field waveform, thus creating an RF FAIMS device, where the field variation with space is translated into a field variation with time that is roughly equivalent when observed from the moving coordinate system of the charged particles.

Figure 8:
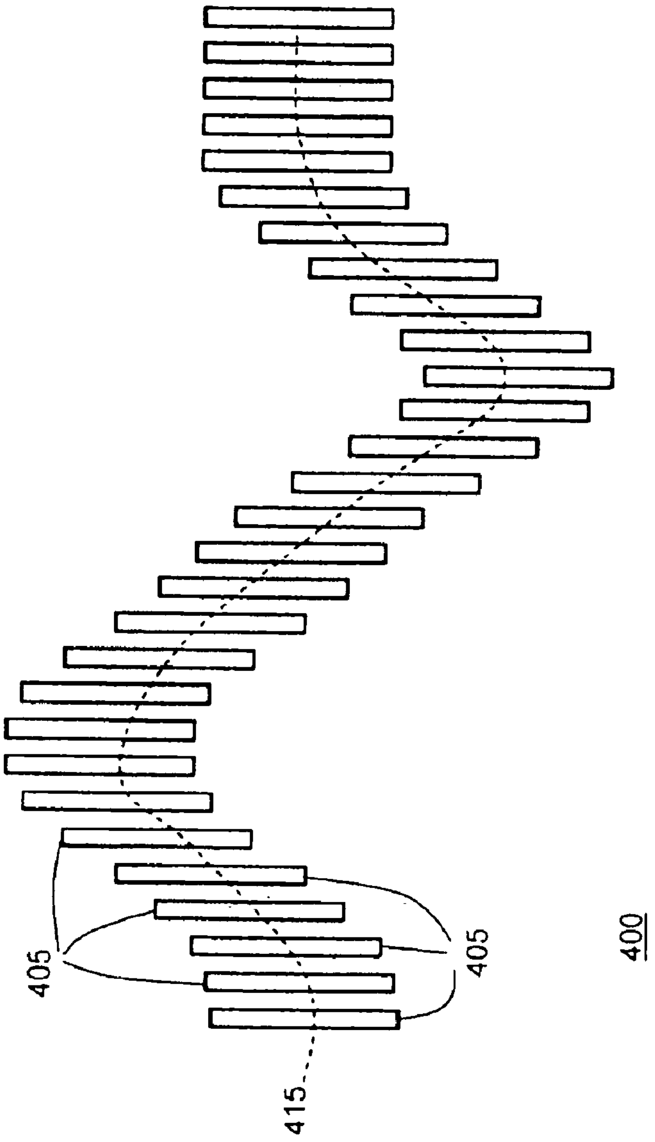
FIG. 8 depicts a top view of an alternative implementation of the alternating voltage conduit of FIGS. 7 and 8.

The arrangement of first and second electrodes of the focusing/guide structure may be modified to achieve certain objectives. For example, FIG. 8 depicts a top view of a focusing/guide structure 400 composed of first electrodes 405 and second electrodes 410, in which adjacent ring electrodes are laterally offset from each other to define a sinuous ion trajectory (depicted as phantom line 415). Alternatively, the axis of the structure could be gradually bent. By creating bends in the ion trajectory, some ion-neutral separation may be achieved (due to the differential effect of the electric fields), thereby enriching the concentration of ions in the gas/ion stream. In another variant of the focusing/guide structure, first and second electrodes having inner diameters of progressively reduced size may be used to create an ion funnel structure similar to that disclosed in U.S. Pat. No. 6,583,408 to Smith et al., but which utilizes alternating DC fields in place of the conventional RF fields.

Referring back to FIG. 1, the differential pumping arrangement 130 will now described in further detail.

As has been discussed, conventional inlet sections having atmospheric pressure ionization sources suffer from a loss of a majority of the ions produced in the sources prior to the ions entering ion optics for transport into filtering and analyzing sections of mass spectrometers. It is believed that high gas flow at an exit end of the ion transfer arrangement is a contributing factor to this loss of high numbers of ions. The neutral gas undergoes an energetic expansion as it leaves the ion transfer tube. The flow in this expansion region and for a distance upstream in the ion transfer tube is typically turbulent in conventional inlet sections. Thus, the ions borne by the gas are focused only to a limited degree in the ion inlet sections of the past. Rather, many of the ions are energetically moved throughout a volume of the flowing gas. It is postulated that because of this energetic and turbulent flow and the resultant mixing effect on the ions, the ions are not focused to a desirable degree and it is difficult to separate the ions from the neutral gas under these flow conditions. Thus, it is difficult to separate out a majority of the ions and move them downstream while the neutral gas is pumped away. Rather, many of the ions are carried away with the neutral gas and are lost. On the other hand, the hypothesis associated with embodiments of the present invention is that to the extent that the flow can be caused to be laminar along a greater portion of an ion transfer tube, the ions can be kept focused to a greater degree. One way to provide the desired laminar flow is to remove the neutral gas through a sidewall of the ion transfer tube so that the flow in an axial direction and flow out the exit end of the ion transfer tube is reduced. Also, by pumping the neutral gas out of the sidewalls to a moderate degree, the boundary layer of the gas flowing axially inside the ion transfer tube becomes thin, the velocity distribution becomes fuller, and the flow becomes more stable.

One way to increase the throughput of ions or transport efficiency in atmospheric pressure ionization interfaces is to increase the conductance by one or more of increasing an inner diameter of the ion transfer tube and decreasing a length of the ion transfer tube. As is known generally, with wider and shorter ion transfer tubes, it will be possible to transport more ions into the ion optics downstream. However, the capacity of available pumping systems limits how large the diameter and how great the overall conductance can be. Hence, in accordance with embodiments of the present invention, the inner diameter of the ion transfer channel 115 (FIG. 1) can be made relatively large and, at the same time, the flow of gas out of the exit end of the ion transfer channel 115 can be reduced to improve the flow characteristic for keeping ions focused toward a center of the gas stream. In this way, the neutral gas can be more readily separated from the ions, and the ions can be more consistently directed through the exit orifice 70 into MS1 downstream. The result is improved transport efficiency and increased instrument sensitivity.

Even if it is found in some or all cases, that turbulent flow results in increased ion transport efficiency, it is to be understood that decreased pressure in a downstream end of the ion transfer channel and increased desolvation due to the decreased pressure may be advantages accompanying the embodiments of the present invention under both laminar and turbulent flow conditions. Furthermore, even with turbulent flow conditions, the removal of at least some of the neutral gas through the sidewall of the ion transfer tube may function to effectively separate the ions from the neutral gas. Even in turbulent flow, the droplets and ions with their larger masses will most likely be distributed more centrally during axial flow through the conduit 60. Thus, it is expected that removal of the neutral gas through the sidewalls will effectively separate the neutral gas from the ions with relatively few ion losses under both laminar and turbulent flow conditions. Still further, the removal of latent heat by pumping the neutral gas through the sidewalls enables additional heating for increased desolvation under both laminar and turbulent flow conditions.

Region 2 containing the conduit 60 is preferably pumped from pumping port 55. As may be seen in FIG. 1, the differential pumping arrangement 130 comprises a plurality of passageways 140 for fluid communication between the interior region containing the channel 115, and the vacuum chamber 50 containing the conduit 60 in Region 2. Neutral gas is pumped from within the interior region 115 and out through the passageways 140 in the differential pumping arrangement 130 into the vacuum chamber 50 where it is pumped away.

A sensor may be connected to the ion transfer conduit 60 and to a controller 58 for sending a signal indicating a temperature of the sidewall or some other part of the ion transfer conduit 60 back to the controller 58. It is to be understood that a plurality of sensors may be placed at different positions to obtain a temperature profile. Thus, the sensor(s) may be connected to the ion transfer conduit 60 for detecting a reduction in heat as gas is pumped through the plurality of passageways 140 in the sidewall of the ion transfer conduit 60.

Figure 9A:
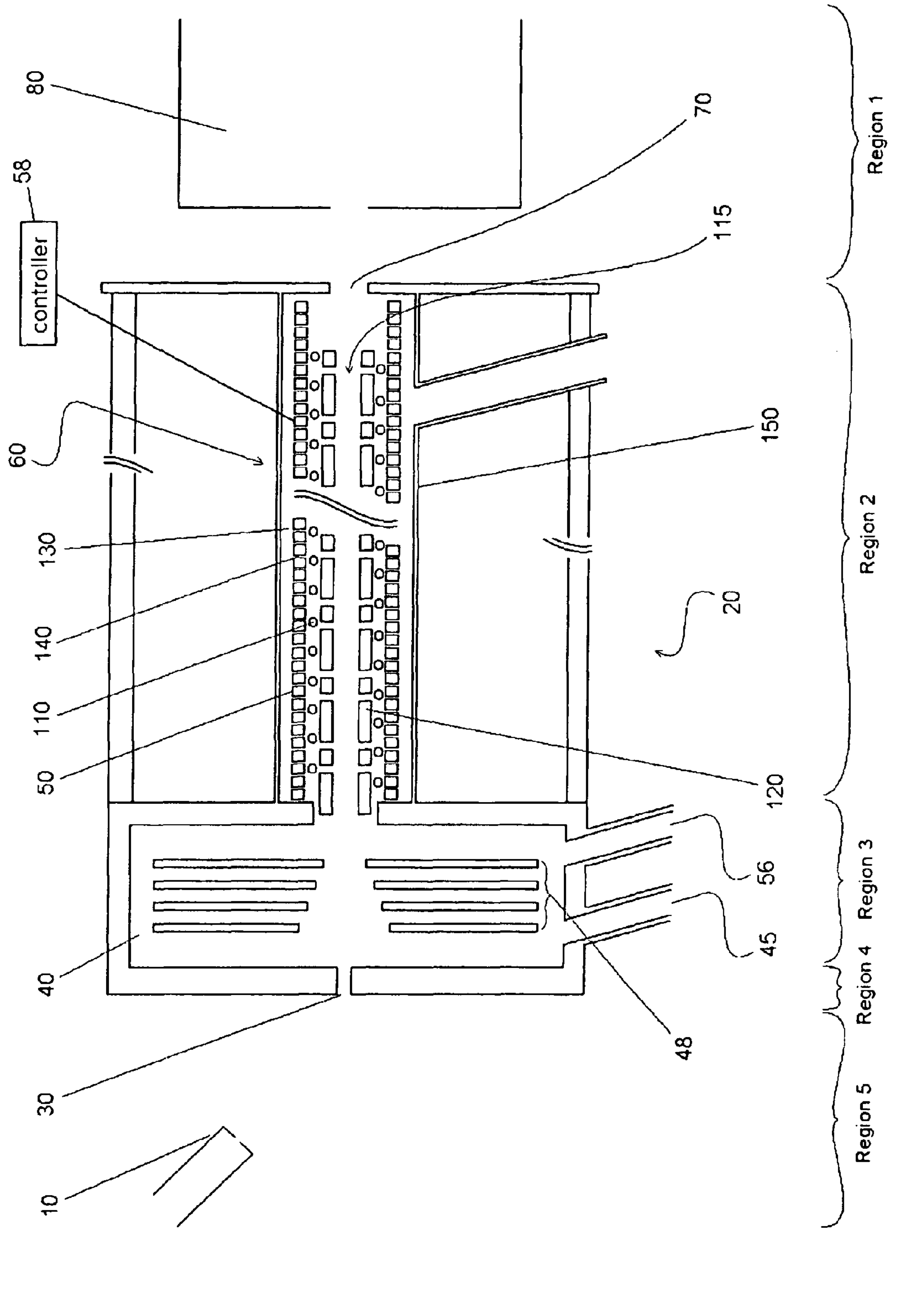
FIGS. 9*a*, 9*b*, 9*c* and 9*d* show alternative embodiments of an ion transfer arrangement in accordance with the present invention.

In an alternative arrangement, shown in FIG. 9*a*, the conduit 60 may be surrounded by an enclosed third vacuum chamber 150. This may be employed to draw gas through the passageways 140 in the walls of the differential pumping arrangement 130. It may equally however be utilized to introduce a flow of gas through the passageways 140 and into the channel 115 of the ion transfer conduit 60 instead of removing the background gas, as described above. This may be achieved by adjusting the pressure in the third vacuum chamber 150 to be between atmospheric pressure and the pressure in the channel 115. By introducing a flow of gas through passageways 140 into the channel 115, more turbulent flow conditions may be created in which sample droplets are disrupted. The more turbulent flow conditions may thus cause the sample droplets to be broken up into smaller droplets. This disruption of the droplets is an external force disruption, as opposed to a coulomb explosion type disruption which also breaks up the droplets. In the embodiment of FIG. 9*a*, an optional additional pumping port 56 is also shown, entering expansion chamber 40. Pumping port 45 has been located towards the front of the plate electrodes 48 whilst pumping port 56 pumps the region between plate electrodes 48 and the entrance to the third vacuum chamber 150.

Figure 9B:
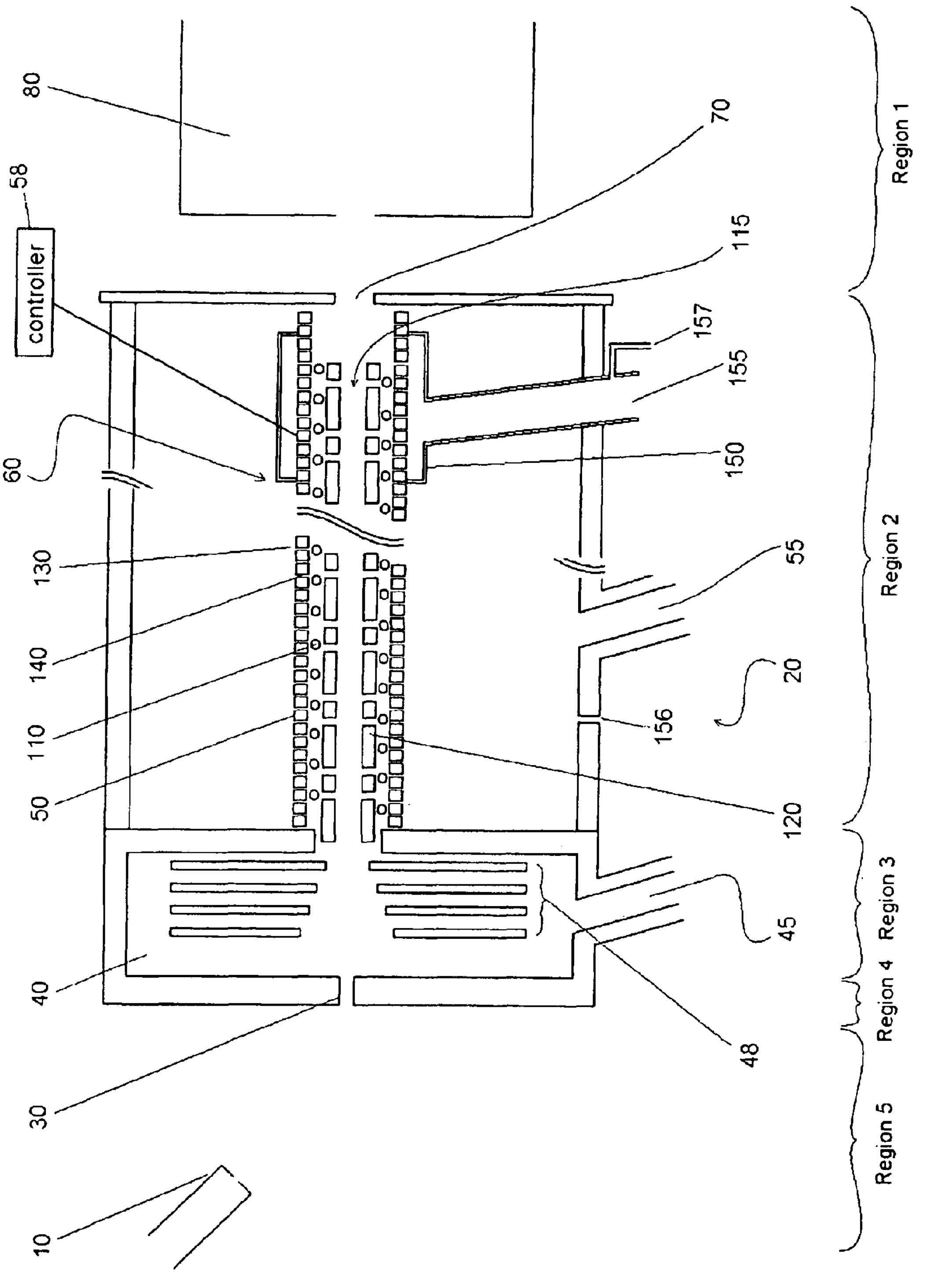

In an application of both external force and coulomb explosion disruption, both removal and addition of gas may be applied in one ion transfer tube. For example, as shown in FIG. 9*b*, the third vacuum chamber 150 is shortened and only encloses a region of the second vacuum chamber 50. By this means gas could be added to either portion of the second vacuum chamber 50, via an inlet 156 or an inlet 156. Thus, an alternating series of external force and coulomb explosion disruptions can be implemented to break up the droplets of the sample.

The wall of the differential pumping arrangement 130 in the embodiments of FIGS. 1 and 9*a*, 9*b*, 9*c* and 9*d*, may be formed from a material that includes one or more of a metal frit, a metal sponge, a permeable ceramic, and a permeable polymer. The passageways 140 may be defined by the pores or interstitial spaces in the material. The pores or interstices in the material of the sidewalls may be small and may form a generally continuous permeable element without discrete apertures. Alternatively, the passageways may take the form of discrete apertures or perforations formed in the sidewalls of the differential pumping arrangement 130. The passageways may be configured by through openings that have one or more of round, rectilinear, elongate, uniform, and non-uniform configurations.

Figure 9C:
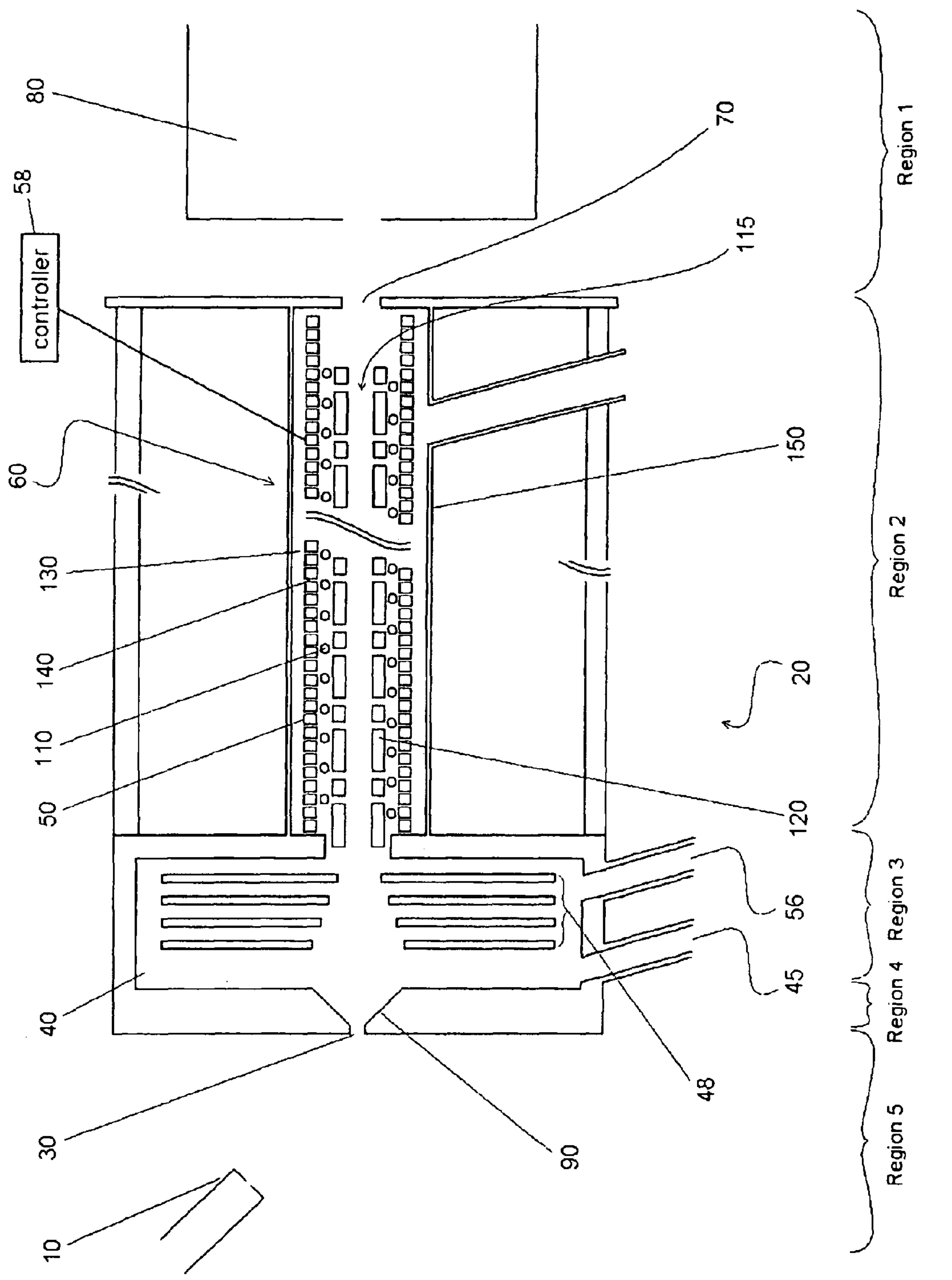
Figure 9D:
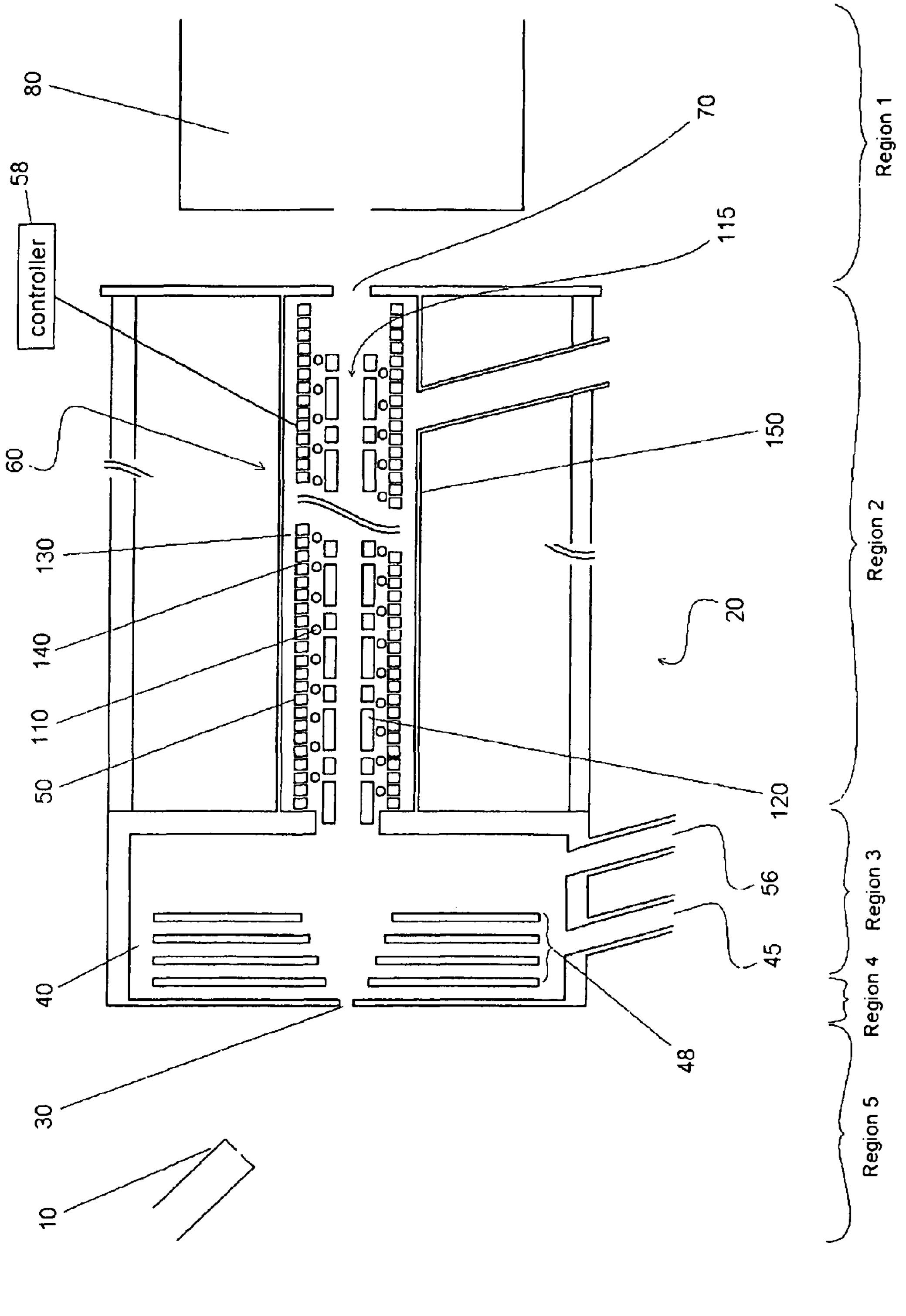

As a further detail FIG. 9*c* shows provisions to improve ion flow in the critical entrance region. The expansion zone 90 in the orifice 30 provides a simple form of jet separation, preferentially transmitting heavier particles relatively close to the axis whilst lighter particles diffuse to the circumference and are not accepted by the subsequent apertures whilst the acceleration plates act to collect the ions. FIG. 9*d* shows an embodiment in which the nozzle plates 48 are reversed in orientation and themselves create the expansion zone, following a very thin entrance plate. With sufficient pressure reduction, heavy (i.e. heavier than the carrier gas) charged particles will easily enter the conduit region with a great deal of the carrier beam and lighter (solvent) ions being skimmed away.

The multiple pumping arrangement shown in FIGS. 9*a, c* and *d* (and which can also be applied to the embodiment of FIG. 9*b*) can help cutting interface cost, as an early reduction of the gas load reduces the pumping requirements for the next stage. Especially the very first stage 45 could reduce the gas load of the following stages by more than 2 even when it is a mere fan blower.

It will be noted from the introductory discussion above that the various parts of the ion transfer arrangement seek to keep the gas flow velocity upon exit from the conduit 60 to below supersonic levels so as to avoid shock waves. One consequence of this is that a skimmer is not necessary on the entrance into MS1 80—that is, the exit aperture 70 from Region 2 can be a simple aperture. It has been observed that the presence of a skimmer on the exit aperture can result in a reduction in ion current so the subsonic velocity of the gas leaving the conduit 60 in fact has a further desirable consequence (a skimmer is not needed).

Though most of the embodiments described above preferably employ ion transfer conduits of circular cross-section (i.e. a tube), the present invention is not limited to tubes. Other cross-sections, e.g. elliptical or rectangular or even planar (i.e. rectangular or elliptical with a very high aspect ratio) might become more preferable, especially when high ion currents or multiple nozzles (nozzle arrays) are employed. The accompanying significant increase in gas flow is compensated by the increase in the number of stages of differential pumping. This may for example be implemented by using intermediate stages of those pumps that are already employed.

Ion transfer channels described in this application lend themselves to be multiplexed into arrays, with adjustment of pumping as described above. Such an arrangement could become optimum for multi-capillary or multi-sprayer ion sources.

What is claimed is:

1. An ion transfer arrangement for transporting ions between a relatively high pressure region and a relatively low pressure region, comprising:

an ion transfer conduit having an inlet opening towards a relatively high pressure chamber, an outlet opening towards a relatively low pressure chamber, and at least one sidewall surrounding an ion transfer channel, the sidewall extending along a central axis between the inlet end and the outlet end;

an evacuable chamber which encloses the ion transfer conduit;

a plurality of apertures formed in the longitudinal direction of the sidewall of the conduit; and a pumping means for evacuating the evacuable chamber so as to remove a portion of the gas within the ion transfer channel through the plurality of apertures in the conduit to the evacuable chamber, the pumping means being configured to evacuate the evacuable chamber to a pressure below atmospheric pressure but high enough to maintain a viscous flow of gas and ions through the ion transfer channel.

2. The ion transfer arrangement of claim 1, wherein the sidewall is formed from a material comprising at least one of a metal frit, a metal sponge, a permeable ceramic, and a permeable polymer, and wherein the apertures in the sidewall are defined by pores or interstitial spaces in the material.

3. The ion transfer arrangement of claim 1, further comprising:

an electrode assembly having a first set of electrodes of a first width D1 in the longitudinal direction of the ion transfer conduit, the electrodes of the first set alternating with electrodes of a second set of electrodes, which have a second width D2 (≧D1) in the longitudinal direction and a DC voltage supply means for supplying a DC voltage of magnitude $V_1$ and a first polarity to the first set of electrodes and a DC voltage of magnitude $V_2$ ($|V_2$51 $\leqq|V_1|$) and a second, opposite polarity relative to the average voltage distribution in the longitudinal direction of the electrode assembly, to the second set of electrodes;

wherein the electrode assembly is formed at least partly within the sidewall of the ion transfer conduit and defines the ion transfer channel.

4. The ion transfer arrangement of claim 3, wherein D2>D1 and $|V_2|<|V_1|$.

5. The ion transfer arrangement of claim 3, further comprising means for applying an RF voltage to the first and second sets of electrodes.

6. A method of transporting ions between a first, relatively high pressure region and a second, relatively low pressure region, comprising the steps of:

admitting, from the relatively high pressure region, a mixture of ions and gas into an inlet opening of an ion transfer conduit having or defining an ion transfer channel, and being located within an evacuable chamber;

evacuating the evacuable chamber so as to remove a portion of the gas in the ion transfer channel through a plurality of passageways in a conduit wall located intermediate the inlet opening and an outlet opening of the ion transfer conduit, the evacuable chamber being evacuated to a pressure which is below atmospheric pressure but is high enough to maintain a viscous flow of gas and ions through the ion transfer channel; and causing the ions and the remaining gas to exit the ion transfer conduit through the exit opening towards the relatively low pressure region.

7. The method of claim 6, wherein the step of evacuating the evacuable chamber in which the conduit is located to a pressure which is below atmospheric pressure but is high enough to maintain a viscous flow of gas and ions through the ion transfer channel, comprises evacuating the chamber to a pressure between about 600 mbar and 1 mbar.

8. The method of claim 6, further comprising focusing ions from the relatively high pressure region into the ion transfer conduit, using one of an aerodynamic or electric lens.

9. The method of claim 6, further comprising back filling the at least partly evacuable chamber with a back filling gas.

10. The method of claim 6, further comprising:

providing, inside the conduit sidewall, an electrode assembly which defines the ion transfer channel and which has a first set of electrodes of a first width D1 in the longitudinal direction of the ion transfer conduit, and a second set of electrodes of a second width D2 (≧D1) in the longitudinal direction and interleaved with the first set of electrodes; and supplying a DC voltage of magnitude $V_1$ and a first polarity to the first set of electrodes and a DC voltage of magnitude $V_2$ ($|V_2| \leqq |V_1|$) and a second, opposite polarity relative to the average voltage distribution in the longitudinal direction of the periodic electrode assembly, to the second set of electrodes.

11. The method of claim 6, further comprising applying an RF voltage to the first and second sets of electrodes.

* * * * *